(12) United States Patent
Kishi et al.

(10) Patent No.: US 9,929,692 B2
(45) Date of Patent: *Mar. 27, 2018

(54) CRYSTAL UNIT, OSCILLATOR, AND METHOD FOR FABRICATING THE CRYSTAL UNIT

(71) Applicant: FUJITSU LIMITED, Kawasaki-shi, Kanagawa (JP)

(72) Inventors: Masakazu Kishi, Kawasaki (JP); Hajime Kubota, Kawasaki (JP); Masayuki Itoh, Kawasaki (JP); Yoshinori Mesaki, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 9 days.

This patent is subject to a terminal disclaimer.

(21) Appl. No.: 15/270,355

(22) Filed: Sep. 20, 2016

(65) Prior Publication Data

US 2017/0093337 A1 Mar. 30, 2017

(30) Foreign Application Priority Data

Sep. 28, 2015 (JP) .................................. 2015-190329

(51) Int. Cl.
| | |
|---|---|
| H03B 5/32 | (2006.01) |
| H03B 15/00 | (2006.01) |
| H01L 41/29 | (2013.01) |
| H01L 41/22 | (2013.01) |
| H01L 41/25 | (2013.01) |

(52) U.S. Cl.
CPC ............. *H03B 15/00* (2013.01); *H01L 41/22* (2013.01); *H01L 41/25* (2013.01); *H01L 41/29* (2013.01); *H03B 5/32* (2013.01)

(58) Field of Classification Search
CPC ....... H01L 1/0475; H01L 41/29; H01L 41/25; H01L 41/22; H03B 5/32; H03B 15/00
USPC ........ 331/158, 154, 116 FE, 116 R, 68, 176; 310/365, 321, 323.06, 311
See application file for complete search history.

(56) References Cited

U.S. PATENT DOCUMENTS

| | | | |
|---|---|---|---|
| 2013/0335157 A1* | 12/2013 | Ishii | .................... H01L 41/0475 331/158 |
| 2016/0163451 A1* | 6/2016 | Wang | .................... H01F 41/042 336/192 |

FOREIGN PATENT DOCUMENTS

| | | |
|---|---|---|
| JP | 2-226905 | 9/1990 |
| JP | 2013-258571 | 12/2013 |
| JP | 2014-23015 | 2/2014 |

* cited by examiner

*Primary Examiner* — Arnold Kinkead
(74) *Attorney, Agent, or Firm* — Staas & Halsey LLP

(57) ABSTRACT

A crystal unit includes: a crystal substrate; and a pair of excitation electrodes formed respectively on both surfaces of the crystal substrate, wherein at least one of the pair of excitation electrodes has a pattern serving as both of an excitation electrode and a coil. An oscillator includes a package and a crystal unit accommodated in the package. The crystal unit includes a crystal substrate, and a pair of excitation electrodes formed respectively on both surfaces of the crystal substrate. At least one of the pair of excitation electrodes has a pattern serving as both of an excitation electrode and a coil. An oscillation circuit is accommodated in the package and electrically connected to the crystal unit.

12 Claims, 24 Drawing Sheets

STRENGTH OF
VIBRATIONAL ENERGY

STRENGTH OF
VIBRATIONAL ENERGY

FIG. 24

|  | MOUNTING AREA | INDUCTANCE | PRODUCTION COST |
|---|---|---|---|
| CONVENTIONAL EXAMPLE | × | ○ | △ |
| FIRST COMPARATIVE EXAMPLE | × | ○ | × |
| SECOND COMPARATIVE EXAMPLE | ○ | ○ | × |
| THIRD COMPARATIVE EXAMPLE | ○ | × | △ |
| FOURTH COMPARATIVE EXAMPLE | ○ | ○ | × |
| FIRST TO SIXTH EMBODIMENTS | ○ | ○ | ○ |

CRYSTAL UNIT, OSCILLATOR, AND METHOD FOR FABRICATING THE CRYSTAL UNIT

CROSS-REFERENCE TO RELATED APPLICATION

This application is based upon and claims the benefit of priority of the prior Japanese Patent Application No. 2015-190329, filed on Sep. 28, 2015, the entire contents of which are incorporated herein by reference.

FIELD

The embodiments discussed herein are related to a crystal unit with a built-in coil, an oscillator, and a method for fabricating the crystal unit with a built-in coil.

BACKGROUND

In an oscillation circuit such as a 3× ($3^{rd}$) overtone oscillation circuit or an oscillator used as a voltage controlled crystal oscillator (VCXO), a coil (or an inductor) called an "extension coil" is typically connected in series in order to secure a variable frequency bandwidth. A coil is a discrete part, and its size is roughly determined by an inductance required for the coil, which hinders miniaturization of the entire oscillation circuit and oscillator.

FIG. 1 is a circuit diagram illustrating an example of an oscillator. The oscillator 1 illustrated in FIG. 1 includes a $3^{rd}$ overtone oscillation circuit as an example of an oscillation circuit, a crystal unit 2, and an extension coil 3. The $3^{rd}$ overtone oscillation circuit includes resistors R1 to R3, an inductor L1, capacitors C1 to C6, a variable capacitor C7, and a transistor Tr, all of which are connected as illustrated in FIG. 1. A power source voltage is applied to a terminal T4, and an output signal of the oscillator 1 is output from a terminal 5. An inductance value of the extension coil 3 is, for example, several μH or so.

FIGS. 2A to 2C illustrate an example of a conventional crystal unit 200, FIG. 2A being a plan view of the crystal unit 200, FIG. 2B being a sectional view of the crystal unit 200, which is taken along a dashed line B-B in FIG. 2A, and FIG. 2C being a sectional view of the crystal unit 200, which is taken along a dashed line C-C in FIG. 2A. In FIGS. 2A to 2C, the crystal unit 200 includes a package 21 made of, e.g., ceramics or the like, a pair of excitation electrodes 22, a crystal substrate 23, a conductive adhesive 24, four electrodes 25-1 to 25-4, and wirings 26-1 and 26-2. The pair of excitation electrodes 22 is disposed on both surfaces of the crystal substrate 23 with the crystal substrate 23 sandwiched therebetween. For example, the lower excitation electrode 22 is electrically connected to the electrode 25-1 by the conductive adhesive 24 via the wiring 26-1. In the sectional view of FIG. 2B, for the purpose of facilitating the understanding of the electrical connection, the wiring 26-1 and the electrode 25-1 (and the electrode 25-2), which are originally invisible, are indicated by a dashed line for the sake of convenience. The upper excitation electrode 22 is electrically connected to the electrode 25-2 by the conductive adhesive 24 via the wiring 26-2. In the sectional view of FIG. 2C, for the purpose of facilitating the understanding of the electrical connection, the wiring 26-2 and the electrode 25-2 (and the electrode 25-1), which are originally invisible, are indicated by a dashed line for the sake of convenience. The wiring 26-1 includes a via connected to the electrode 25-1 through the package 21. Similarly, the wiring 26-2 includes a via connected to the electrode 25-2 through the package 21. In this case, the electrodes 25-3 and 25-4 are not electrically connected to the excitation electrode 22 and can be used as, e.g., pads when the package 21 is installed. However, the electrodes 25-3 and 25-4 may be electrically connected to the excitation electrode 22.

The size of the package 21 on the plan view is, for example, 3.2 mm×2.5 mm, as illustrated in FIG. 2A, and the height of the package 21 on the side view is, for example, 0.5 mm to 0.7 mm, as illustrated in FIGS. 2B and 2C. When a chip coil, which is a discrete part, is used for the extension coil 3 having the inductance of several μH or so as mentioned above, the size of the chip coil is, for example, 1.0 mm×0.5 mm×0.5 mm. However, when the chip coil is connected to the crystal unit 200 as illustrated in FIGS. 2A to 2C, the size of the portion surrounded by a dashed line in FIG. 1 becomes relatively large, which makes it difficult to miniaturize the oscillator 1.

Therefore, it is conceivable to use an extension coil, which is not a discrete part, for the crystal unit. However, when this chip coil is disposed in the side of the crystal unit within the package, the occupation area of the package increases, which makes it difficult to miniaturize the oscillator 1. Meanwhile, when this chip coil is disposed above or below the crystal unit within the package, although the mounting area corresponding to the chip coil may be reduced as compared to the case where the chip coil is disposed in the side of the crystal unit, the height of the package increases, which also makes it difficult to miniaturize the oscillator 1. In addition, when the chip coil is made thin, it is difficult to obtain the inductance of, e.g., several μH or so required for the extension coil.

In this way, it is difficult to miniaturize the crystal unit with a built-in a coil where an extension coil is built-in since the size of the extension coil is roughly determined by the inductance required for the extension coil.

It is difficult to install a coil without compromising the size of the crystal unit with a built-in coil.

The followings are a reference documents.
[Document 1] Japanese Laid-Open Patent Publication No. 2014-023015,
[Document 2] Japanese Laid-Open Patent Publication No. 2013-258571, and
[Document 3] Japanese Laid-Open Patent Publication No. 02-226905.

SUMMARY

According to an aspect of the invention, a crystal unit includes: a crystal substrate; and a pair of excitation electrodes formed respectively on both surfaces of the crystal substrate, wherein at least one of the pair of excitation electrodes has a pattern serving as both of an excitation electrode and a coil.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 24 is a table illustrating results of evaluation on a mounting area, an inductance and a production cost for the conventional example, the first to fourth examples, and the first to sixth embodiments.

DESCRIPTION OF EMBODIMENTS

In one aspect, a pattern serving as both of an excitation electrode and a coil is formed on at least one of surfaces of a crystal substrate.

Hereinafter, exemplary embodiments of a crystal unit with a built-in a coil, an oscillator, and a method for fabricating the coil built-in crystal unit will be described with reference to the drawings. Throughout the drawings, each part is schematically illustrated, and the size (length, width, and thickness) thereof is not drawn to scale.

Embodiments

To begin with, some comparative examples of a coil built-in crystal unit which does not use an extension coil which is a discrete part for a crystal unit will be described.

Figure 2A:
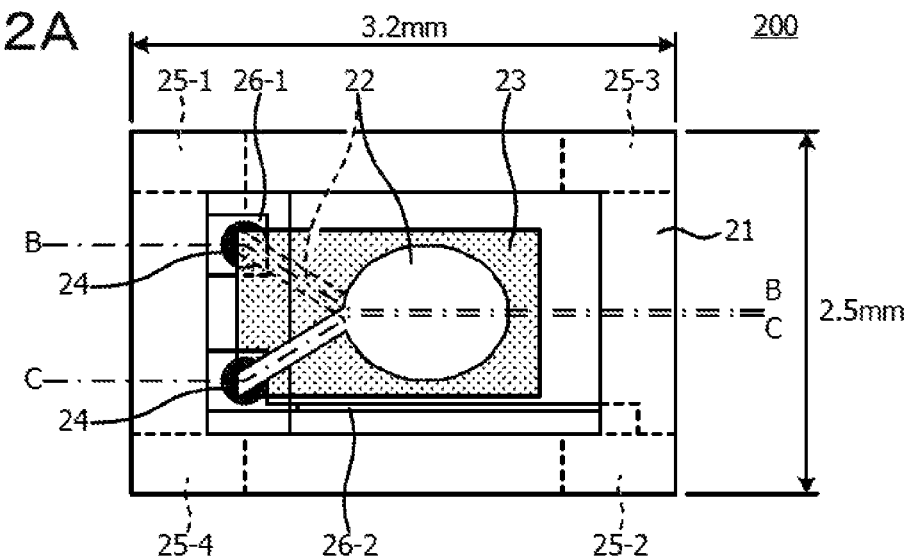
FIGS. 2A to 2C are views illustrating an example of a conventional crystal unit.
Figure 2B:
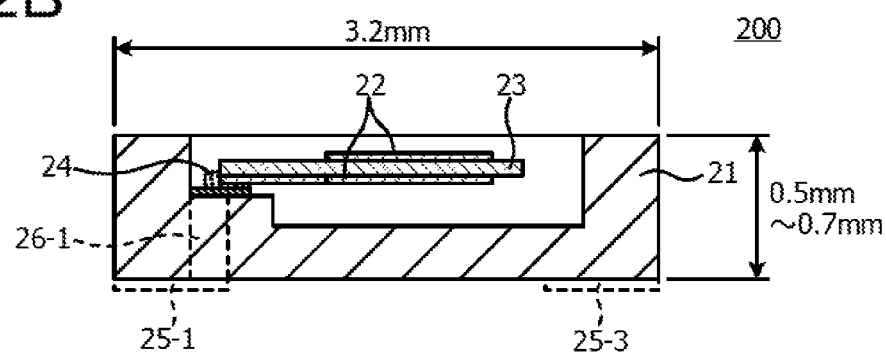
Figure 2C:
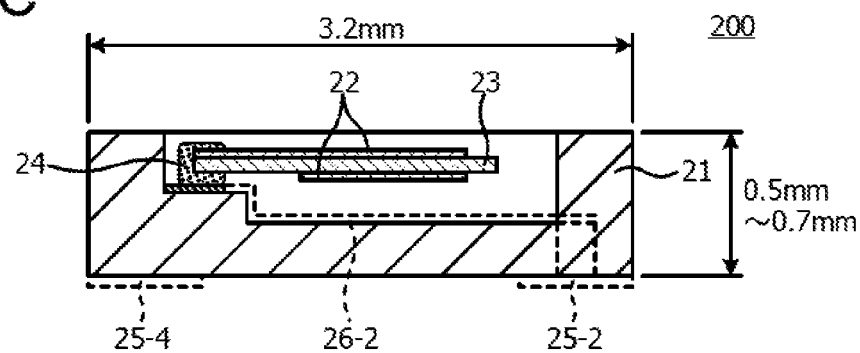
Figure 3A:
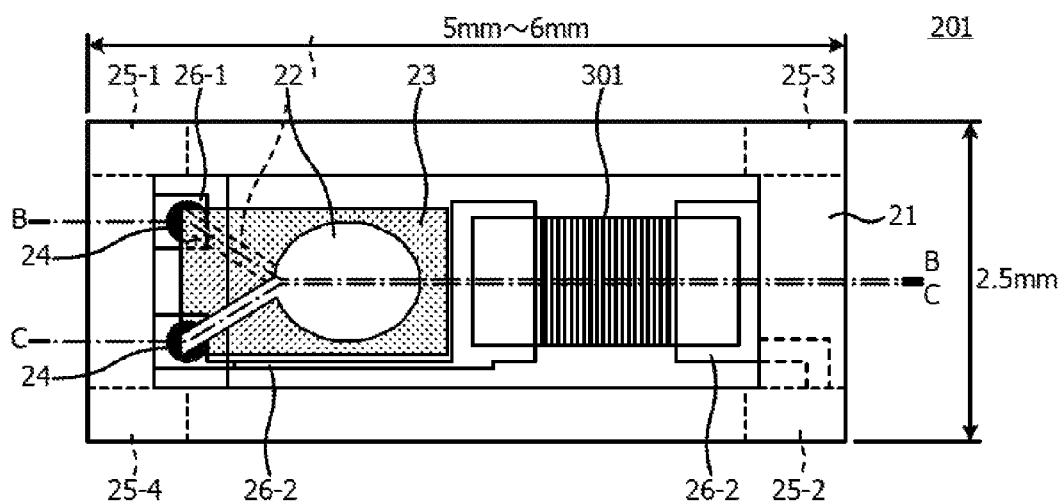
FIGS. 3A to 3C are views illustrating a first comparative example of a crystal unit.
Figure 3B:
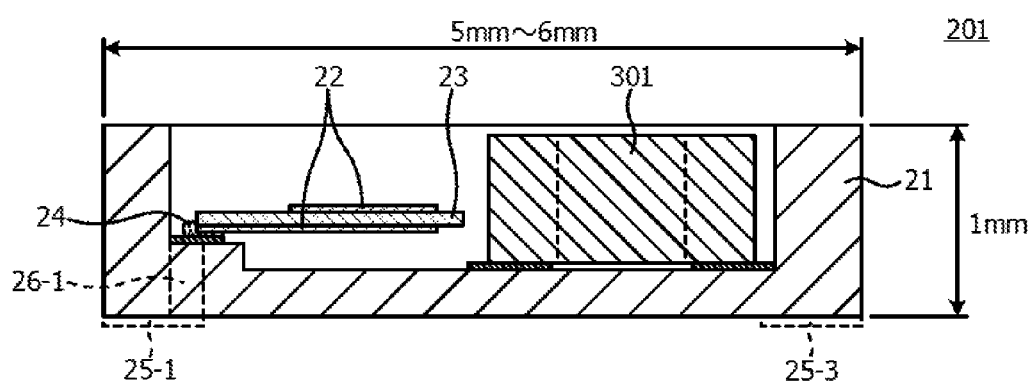
Figure 3C:
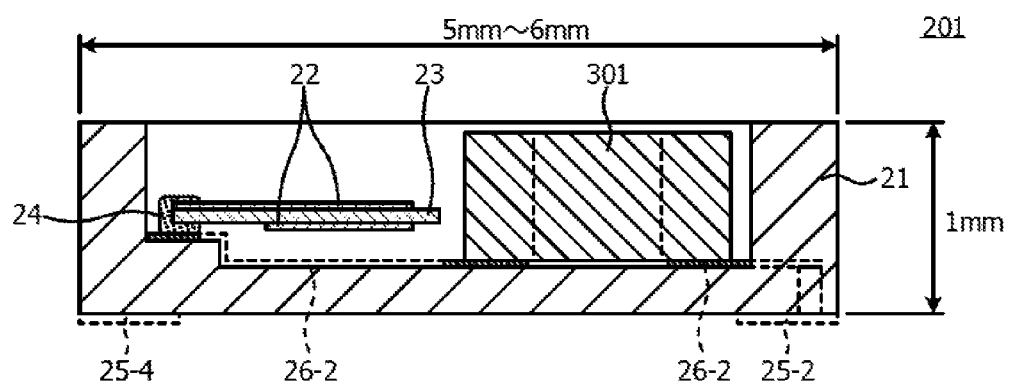

FIGS. 3A to 3C are views illustrating a first comparative example of a crystal unit. In FIGS. 3A to 3C, substantially the same parts as those in FIGS. 2A to 2C will be denoted by the same reference numerals as used in FIGS. 2A to 2C, and explanation of which will be omitted. FIG. 3A is a plan view of a crystal unit 201, FIG. 3B is a sectional view of the crystal unit 201, which is taken along an alternate long and short dashed line B-B in FIG. 3A, and FIG. 3C is a sectional view of the crystal unit 201, which is taken along a dashed line C-C in FIG. 3A.

In the first comparative example, a chip coil 301 is simply disposed on a wiring 26-2 within a package 21 of the crystal unit 201. However, the size of the chip coil 301 having an inductance of several $\mu N$ or so is, for example, 1.0 mm×0.5 mm×0.5 mm, as mentioned above. Therefore, the package size of the package 21 is, for example, about 5 mm to 6 mm×2.5 mm×1 mm, which makes it difficult to miniaturize an oscillator.

Figure 4A:
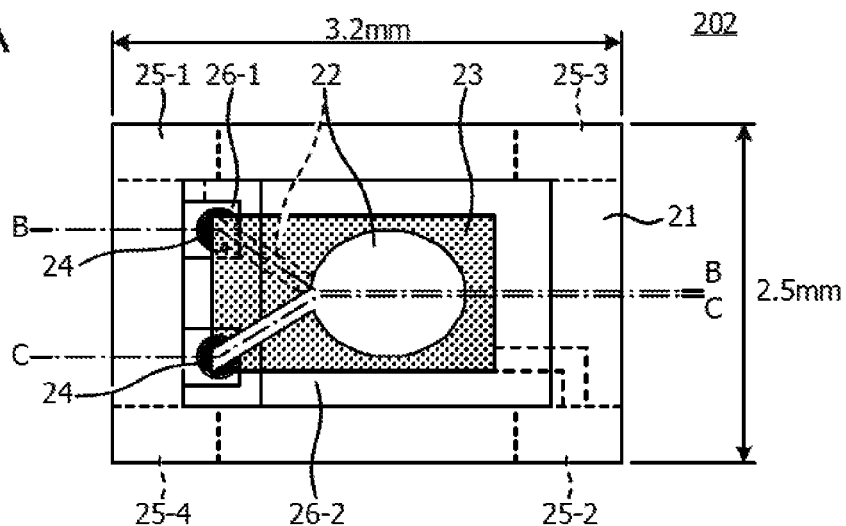
FIGS. 4A to 4C are views illustrating a second comparative example of a crystal unit.
Figure 4B:
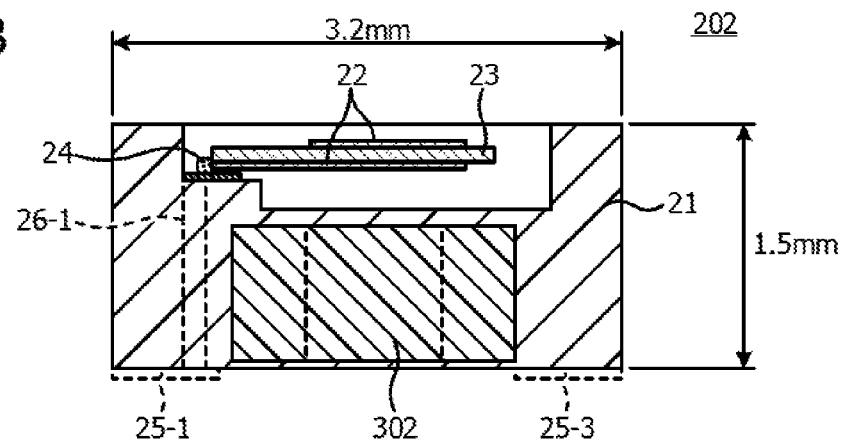
Figure 4C:
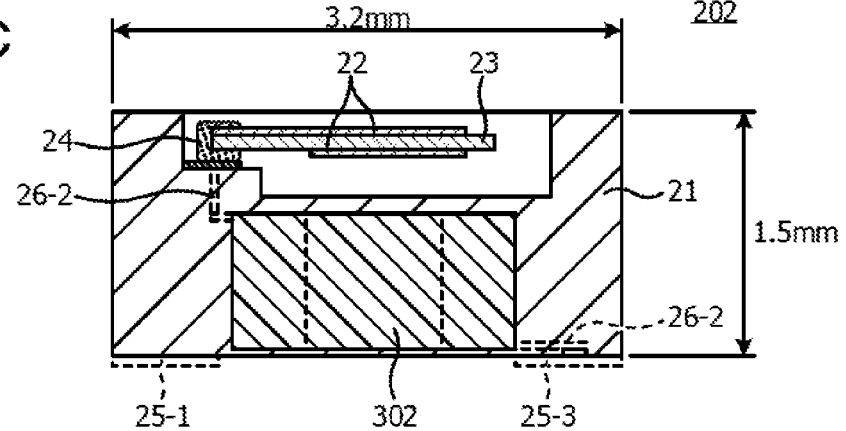

FIGS. 4A to 4C are views illustrating a second comparative example of a crystal unit. In FIGS. 4A to 4C, substantially the same parts as those in FIGS. 2A to 2C will be denoted by the same reference numerals as used in FIGS. 2A to 2C, and explanation of which will be omitted. FIG. 4A is a plan view of a crystal unit 202, FIG. 4B is a sectional view of the crystal unit 202, which is taken along an alternate long and short dashed line B-B in FIG. 4A, and FIG. 4C is a sectional view of the crystal unit 202, which is taken along an alternate long and short dashed line C-C in FIG. 4A.

In the second comparative example, a laminated coil 302 is disposed on a wiring 26-2 within a package 21 at a lower side of the crystal unit 201. In this case, although a mounting area corresponding to the coil is small, the height of the package 21 increases to about 1.5 mm, which makes it difficult to miniaturize an oscillator. In addition, an upper portion of the package 21 where the crystal unit 202 is formed has fewer thick layers, whereas a lower portion of the package 21 where the laminated coil 302 is formed has more thin layers. Therefore, the upper and lower portions of the package 21 undergo different fabricating processes, which results in an increase in production costs.

Figure 5A:
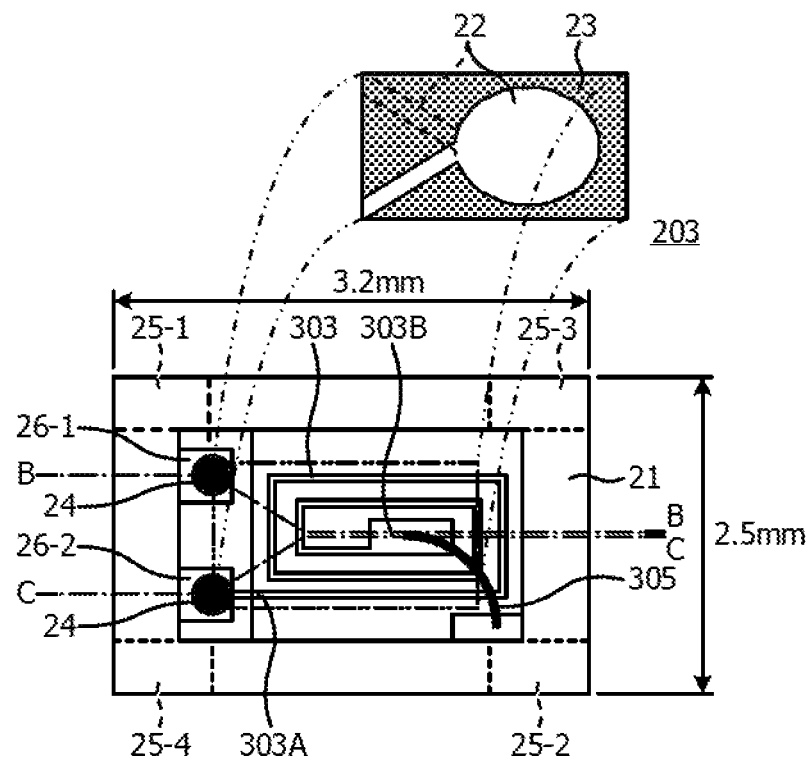
FIGS. 5A to 5C are views illustrating a third comparative example of a crystal unit.
Figure 5B:
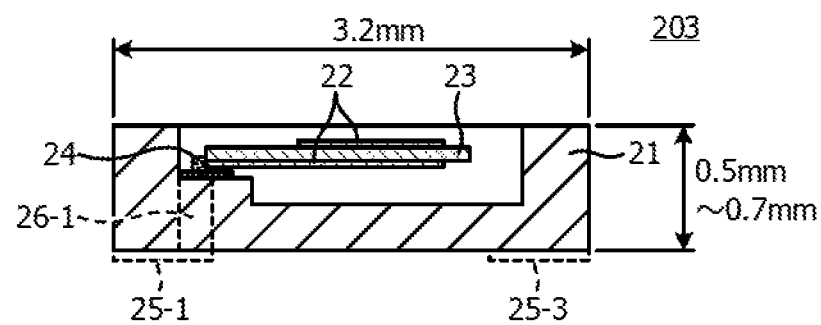
Figure 5C:
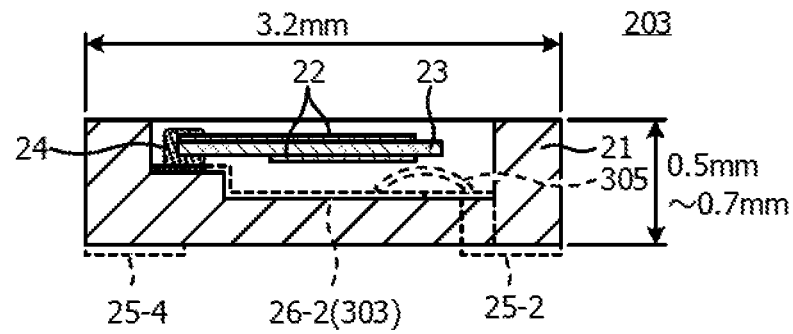

FIGS. 5A to 5C are views illustrating a third comparative example of a crystal unit. In FIGS. 5A to 5C, substantially the same parts as those in FIGS. 2A to 2C will be denoted by the same reference numerals as used in FIGS. 2A to 2C, and explanation of which will be omitted. FIG. 5A is a plan view of a crystal unit 203, FIG. 5B is a sectional view of the crystal unit 203, which is taken along an alternate long and short dashed line B-B in FIG. 5A, and FIG. 5C is a sectional view of the crystal unit 203, which is taken along an alternate long and short dashed line C-C in FIG. 5A. A crystal substrate 23 and a pair of excitation electrodes 22 illustrated in the upper left of FIG. 5A are disposed at a position indicated by an alternate long and two short dashed line.

In the third comparative example, in an internal space of the package 21 where the crystal unit 203 is installed, a pattern 303 having an inductance component is formed on a surface of the package 21 which faces the crystal unit 203. The pair of excitation electrodes 22 with the crystal substrate 23 sandwiched therebetween is disposed above the pattern 303 in a side view in the internal space. An end portion 303A of the pattern 303 is electrically connected to the upper excitation electrode 22, and a central portion 303B of the pattern 303 is electrically connected to an electrode 25-2 by a wire bonding 305 via a wiring 26-2. However, in general, a width of the pattern 303 which can be formed on the surface of the package 21 in the package 21 generally made of ceramics or the like is, for example, about 100 μm, and a line length of about 120 mm is required to obtain an inductance of several μH or so, which makes it difficult to miniaturize an oscillator. In addition, the use of the wire bonding 305 contributes to increase in production costs.

In order to obtain an inductance of several μH or so, it is conceivable to form the pattern 303 having a width of, e.g., 1 μm. In this case, it may be considered to make the interior of the package 21 flat by polishing after completion of the package 21 and form the pattern 303 by photolithography. However, it is difficult to perform the polishing for flatness of the interior of the package 21. Further, the pattern 303 is a thin film for miniaturization, whereas electrodes 21-1 and 21-2 and others of the bottom surface of the package 21 are thick films for heat resistance in soldering. Therefore, even when the pattern 303 of a miniaturized thin film could be formed, it may be necessary to provide the interior and the bottom surface of the package 21 with different fabricating processes, which results in an increase in production costs. In addition, it is difficult to achieve the coexistence of the thin pattern 303 and the thick electrodes 21-1 and 21-2 on the bottom surface of the package 21 in a fabricating process.

Figure 6A:
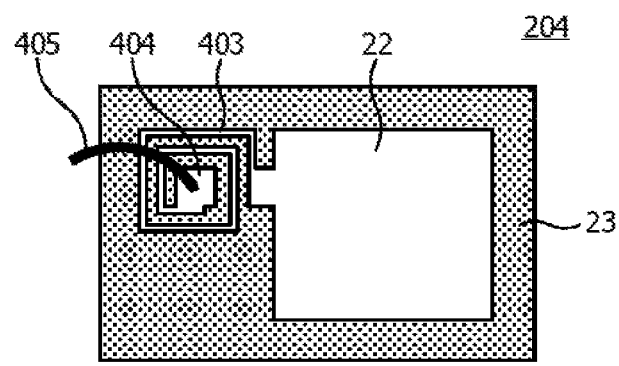
FIGS. 6A to 6C are views illustrating a fourth comparative example of a crystal unit.
Figure 6B:
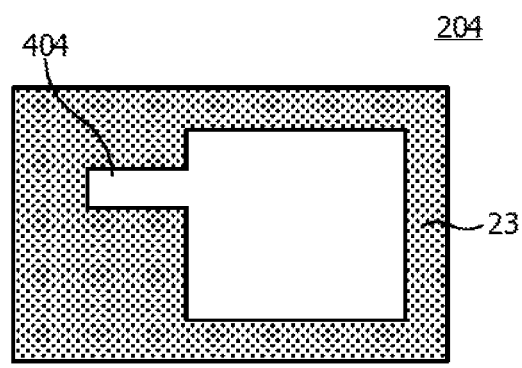
Figure 6C:
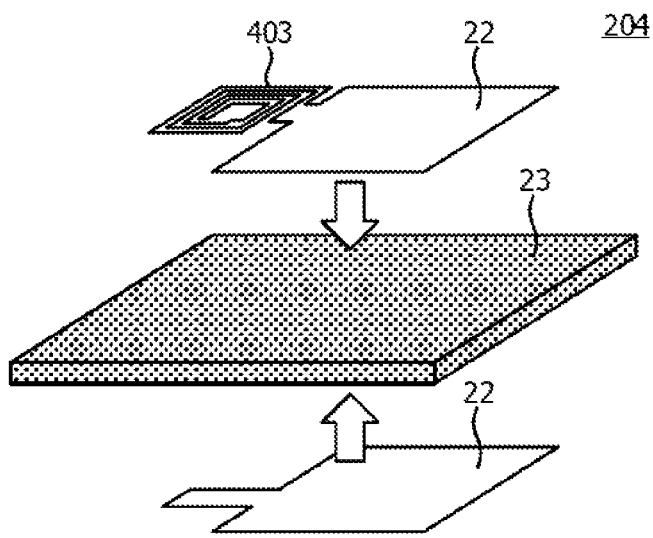

FIGS. 6A to 6C are views illustrating a fourth comparative example of a crystal unit. In FIGS. 6A to 6C, substantially the same parts as those in FIGS. 2A to 2C will be denoted by the same reference numerals as used in FIGS. 2A to 2C, and explanation of which will be omitted. FIG. 6A is a top view of a crystal unit 204, FIG. 6B is a bottom view of the crystal unit 204, and FIG. 6C is an exploded perspective view of the crystal unit 204. Illustration of package, electrodes or others is omitted in these figures.

In the fourth comparative example, as illustrated in FIGS. 6A and 6C, a spiral coil 403 and a drawing-out pad 404 are disposed adjacent and electrically connected to an upper excitation electrode 22 of a crystal substrate 23. In addition, as illustrated in FIGS. 6B and 6C, the drawing-out pad 404 is electrically connected to a lower excitation electrode 22 of the crystal substrate 23. Such a configuration requires a wiring via a wire bonding or an insulating film for connection with an external side. Although an inductance of the spiral coil 403 may be controlled by photolithography, the drawing-out pad 404 is connected to the external side by a wire bonding 405 or the like, which results in an increase in production costs. In addition, instead of using the wire boding 405, when the drawing-out pad 404 is electrically connected to a lead electrode by a conductive adhesive, an amount of the conductive adhesive has to be controlled in accordance with the size of the drawing-out pad 404, which makes a fabricating process complicated. In addition, when the size of the drawing-out pad 404 is increased to facilitate the control of the amount of the conductive adhesive, it is difficult to obtain an inductance of several μH or so with the spiral coil 403.

In contrast to the aforementioned first to fourth comparative examples, the following embodiments involve forming a pattern, which serves as both of an excitation electrode and a coil of a crystal unit, on at least one of surfaces of a crystal substrate and providing an inductance component to the excitation electrode.

Figure 7A:
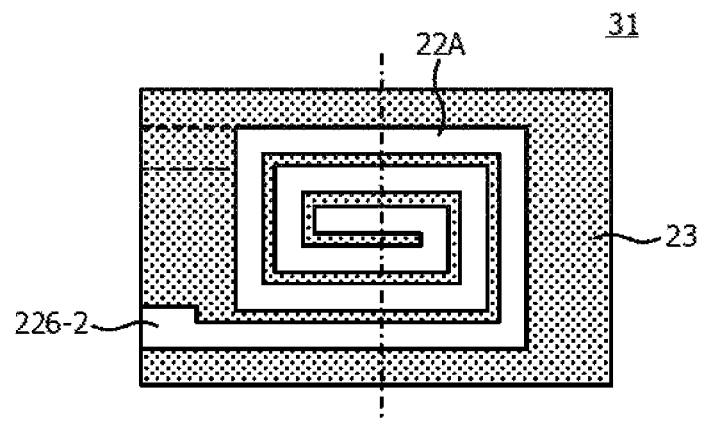
FIGS. 7A to 7C are views illustrating a crystal unit according to a first embodiment.
Figure 7B:
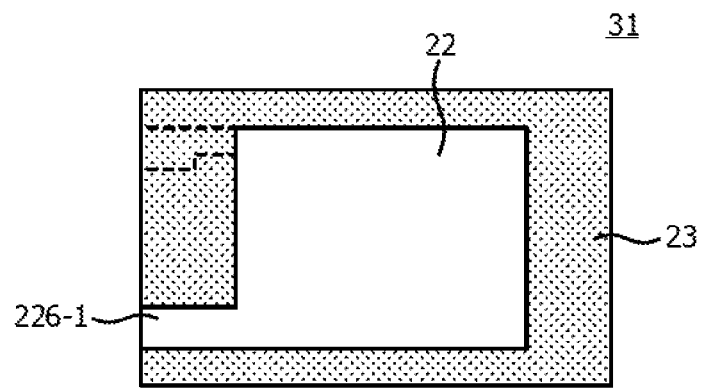
Figure 7C:
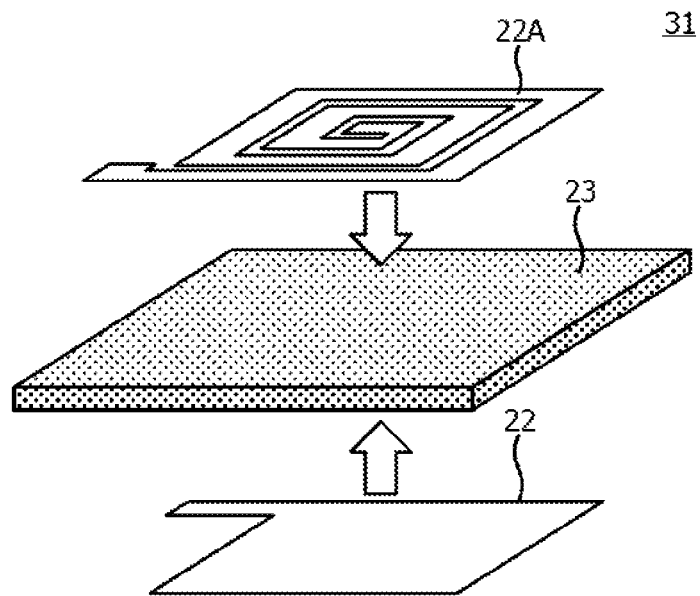

FIGS. 7A to 7C are views illustrating a crystal unit according to a first embodiment. In FIGS. 7A to 7C, substantially the same parts as those in FIGS. 2A to 2C will be denoted by the same reference numerals as used in FIGS. 2A to 2C, and explanation of which will be omitted. FIG. 7A is a top view of a crystal unit 31 as an example of a coil built-in crystal unit, FIG. 7B is a bottom view of the crystal unit 31, and FIG. 7C is an exploded perspective view of the crystal unit 31. Illustration of package, electrodes or others is omitted in these figures.

In the first embodiment, as illustrated in FIGS. 7A and 7C, an upper excitation electrode 22A of a crystal substrate 23 is formed in a spiral pattern, which serves as both of the excitation electrode and a coil, such that the upper excitation electrode 22A has an inductance component corresponding to an extension coil. A central portion of the pattern of the upper excitation electrode 22A is opened, and a drawing-out pad 226-2 at an end portion of the pattern is electrically connected to an electrode 25-2 (not illustrated) by a conductive adhesive 24 (not illustrated) via a wiring 26-2 (not illustrated). Meanwhile, as illustrated in FIGS. 7B and 7C, a drawing-out pad 226-1 of a lower excitation electrode 22 of the crystal substrate 23 is electrically connected to an electrode 25-1 (not illustrated) by a conductive adhesive 24 (not illustrated) via a wiring 26-1 (not illustrated). The upper excitation electrode 22A having the inductance component and the lower excitation electrode 22 may be exchanged.

Although, in this embodiment, the spiral pattern of the excitation electrode 22A has a rectangular spiral shape in accordance with the rectangular excitation electrode 22, the spiral pattern of the excitation electrode 22A may have, e.g., a circular spiral shape. Further, the pattern of the excitation electrode 22A is not limited to spiral patterns of rectangular, circular, elliptical shapes and the like, i.e., not particularly limited as long as the excitation electrode 22A can be provided with an inductance component corresponding to an extension coil. Further, the excitation electrode 22A may have a film configuration including an electrode material containing a magnetic material or an electrode material formed of a magnetic material itself, or a film configuration including a magnetic material for reinforcing an inductance component although it cannot directly serve as an electrode material. In other words, the film configuration of the excitation electrode 22A is not particularly limited as long as it can be provided with an inductance component corresponding to an extension coil connected to the crystal unit 31.

In addition, the shape of the excitation electrode 22 is not limited to rectangular, circular, elliptical shapes and the like and may be different from the shape of the pattern of the excitation electrode 22A.

A surface of a crystal substrate used for a crystal unit has high flatness, and an excitation electrode can be formed on the substrate surface, e.g., by photolithography. Therefore, a pattern providing an inductance component to the excitation electrode can be formed at the same time when the excitation electrode is formed. In addition, for example, by using photolithography, a pattern having an inductance of, e.g., several μH or so can be formed, as will be described later. In addition, it is to be understood that a method for forming the pattern of the excitation electrode is not limited to the photolithography but may employ a charged particle beam exposure technology including an electron beam exposure technology, or the like.

In this embodiment, since at least one excitation electrode and the extension coil are integrated with each other, and a connection from the excitation electrode to an electrode installed in a package does not intersect with a pattern of the integrated excitation and extension coil, there is no need for a wiring which interposes a wire bonding or an insulating film. Therefore, it is possible to fabricate a coil built-in crystal unit using the fabricating process as the fabricating process of the conventional crystal unit 200 as illustrated in FIG. 2, which can result in suppression of increase in production costs.

Figure 8A:
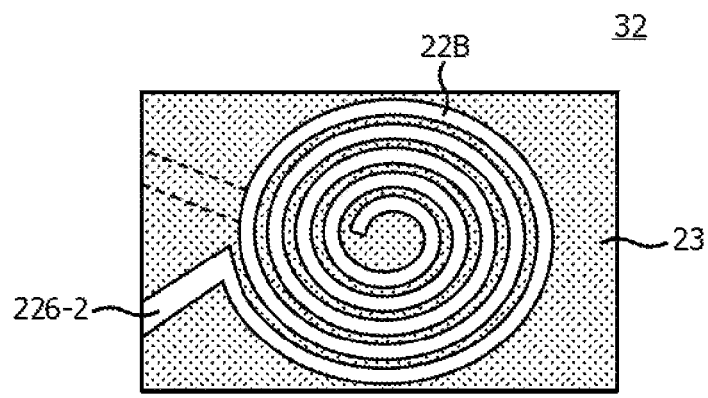
FIGS. 8A to 8C are views illustrating a crystal unit according to a second embodiment.
Figure 8B:
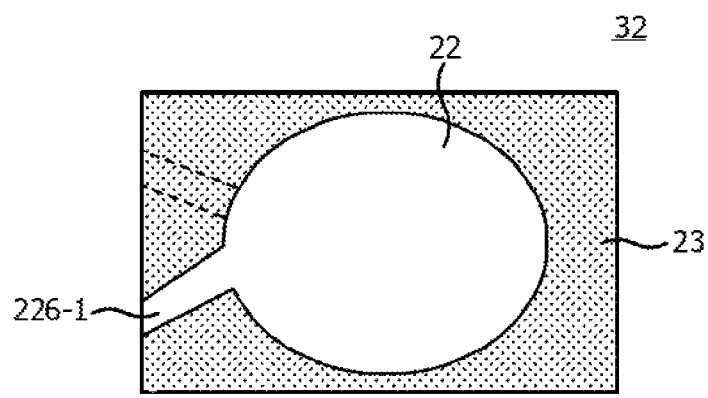
Figure 8C:
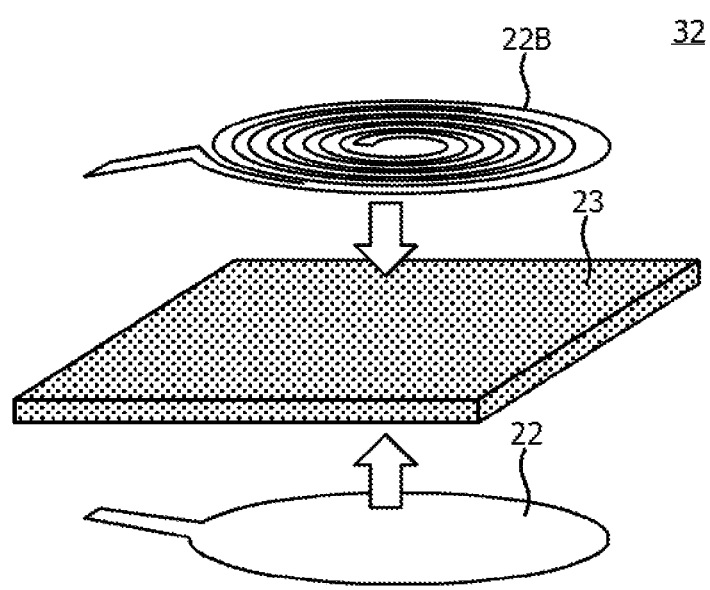

FIGS. 8A to 8C are views illustrating a crystal unit according to a second embodiment. In FIGS. 8A to 8C, substantially the same parts as those in FIGS. 7A to 7C will be denoted by the same reference numerals as used in FIGS. 7A to 7C, and explanation of which will be omitted. FIG. 8A is a top view of a crystal unit 32 as an example of a coil built-in crystal unit, FIG. 8B is a bottom view of the crystal unit 32, and FIG. 8C is an exploded perspective view of the crystal unit 32. Illustration of packages, electrodes or others is omitted in these figures.

In the second embodiment, the crystal unit 32 has the same configuration as the crystal unit 31 illustrated in FIGS. 7A and 7C, except that a spiral pattern serving as both of an excitation electrode and a coil such that an upper excitation electrode 22B has an inductance component has a circular spiral shape in accordance with a circular excitation electrode 22.

Next, an example of a method for fabricating a coil built-in crystal unit will be described with reference to FIGS. 9A to 16. FIGS. 9A to 16 are views used to explain one example of a method for fabricating a coil built-in crystal unit. FIGS. 9A, 10A, 11A, 12A, 13A, 14A, and 15A are plan views, and FIGS. 9B, 10B, 11B, 12B, 13B, 14B, and 15B are transparent side views. For convenience of explanation, it is assumed in this example that photolithography is used to fabricate the coil built-in crystal unit 31 illustrated in FIGS. 7A to 7C.

Figure 9A:
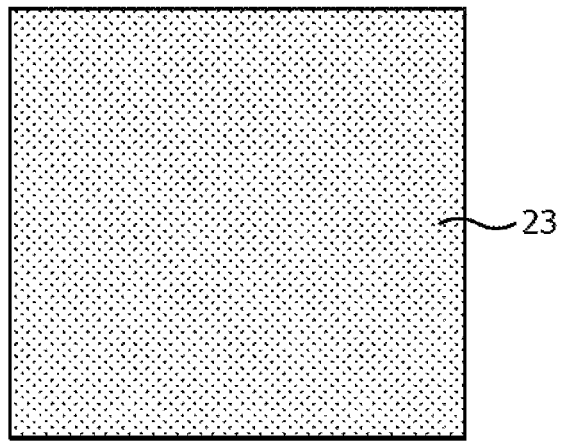
FIGS. 9A and 9B are views used to explain an example of a method for fabricating a crystal unit.
Figure 9B:
Figure 10A:
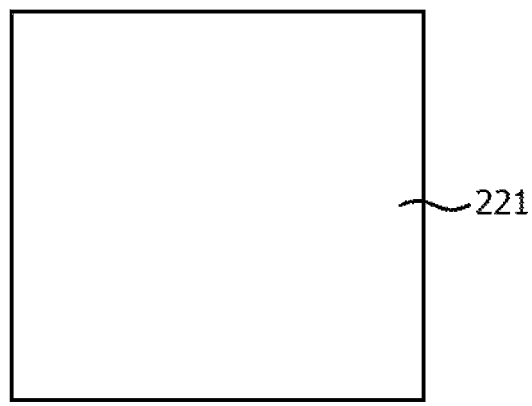
FIGS. 10A and 10B are views used to explain an example of a method for fabricating a crystal unit.
Figure 10B:
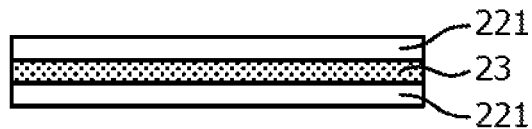
Figure 11A:
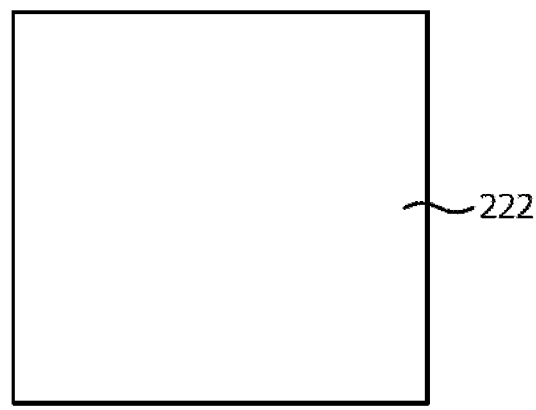
FIGS. 11A and 11B are views used to explain an example of a method for fabricating a crystal unit.
Figure 11B:
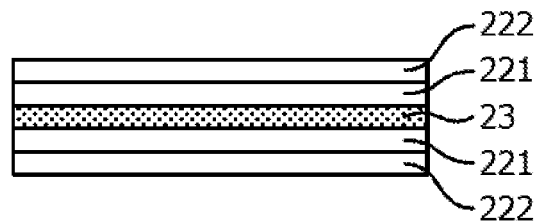

First, as illustrated in FIGS. 9A and 9B, a crystal substrate 23 polished to a thickness corresponding to an oscillation frequency is prepared. Next, as illustrated in FIGS. 10A and 10B, electrode films 221 that become a pattern corresponding to an excitation electrode and/or an extension coil are respectively formed on both surfaces of the crystal substrate 23. The conductive material used for the electrode films 221 is gold, silver, aluminum or the like. In order to increase adhesion strength, a thin film made of nichrome, platinum or the like may be interposed between the conductive material and the crystal substrate 2. Next, as illustrated in FIGS. 11A and 11B, a resist 222 is formed on each of the electrode films 221.

Figure 12A:
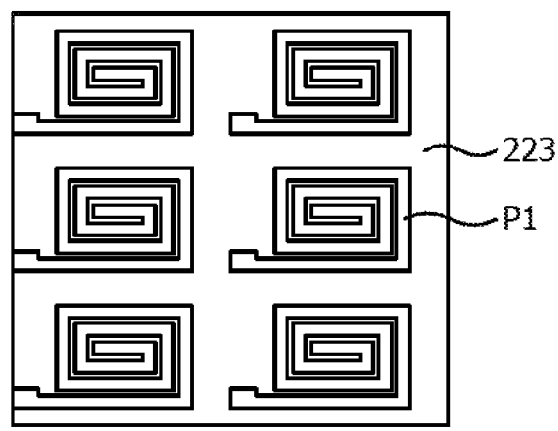
FIGS. 12A and 12B are views used to explain an example of a method for fabricating a crystal unit.
Figure 12B:
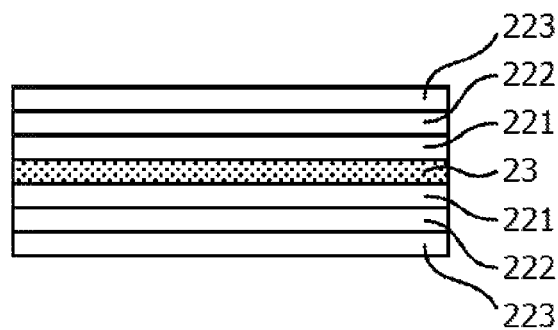

Next, as illustrated in FIGS. 12A and 12B, a mask 223 having a plurality of patterns P1 corresponding to an upper excitation electrode 22A is placed on an upper resist 222, a mask 223 having a plurality of patterns corresponding to a lower excitation electrode 22 is placed below a lower resist 222, and the resists 222 are exposed with light transmitted through the respective masks 223. The patterns P1 of the mask 223 placed on the upper resist 222 have a shape for providing the upper excitation electrode 22A with an inductance component corresponding to an extension coil. Meanwhile, the patterns of the mask 223 placed below the lower resist 222 have a shape for forming the lower excitation electrode 22.

Figure 13A:
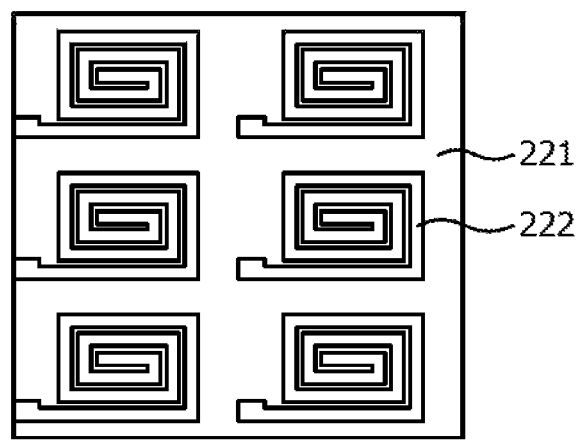
FIGS. 13A and 13B are views used to explain an example of a method for fabricating a crystal unit.
Figure 13B:
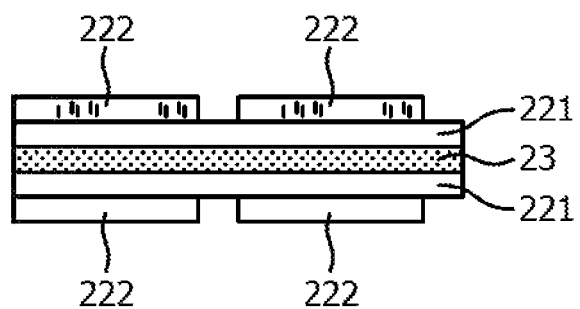
Figure 14A:
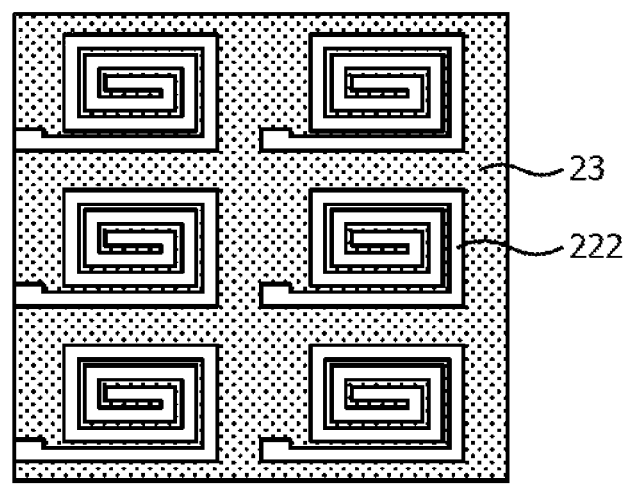
FIGS. 14A and 14B are views used to explain an example of a method for fabricating a crystal unit.
Figure 14B:
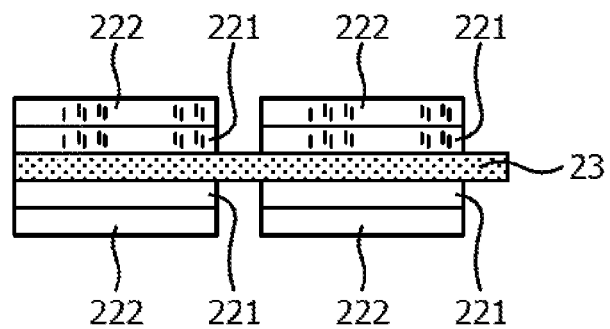
Figure 15A:
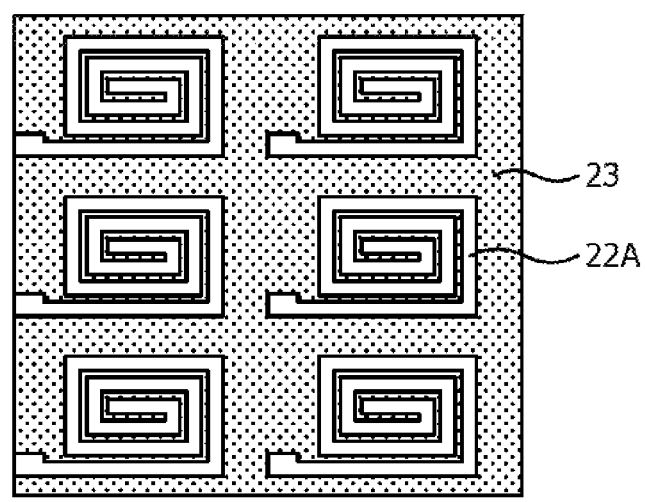
FIGS. 15A and 15B are views used to explain an example of a method for fabricating a crystal unit.
Figure 15B:
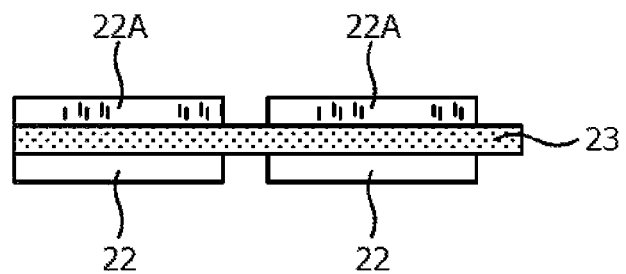
Figure 16:
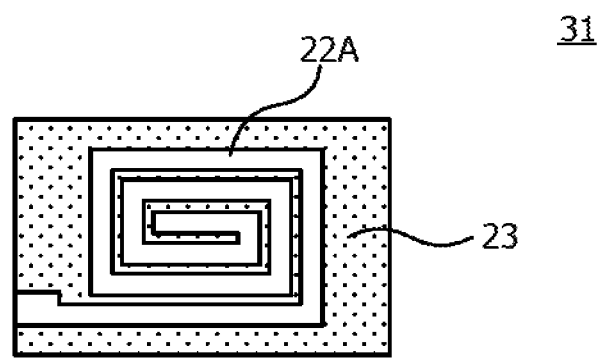
FIG. 16 is a view used to explain an example of a method for fabricating a crystal unit.

Next, as illustrated in FIGS. 13A and 13B, patterns of the exposed resists 222 are developed. In addition, as illustrated in FIGS. 14A and 14B, by etching and patterning the electrode films 221 using the developed patterns of the resists 222 as a mask, the upper electrode film 221 is formed in a pattern of the upper excitation electrode 22A, and the lower electrode film 221 is formed in a pattern of the lower excitation electrode 22. Further, as illustrated in FIGS. 15A and 15B, the resists 222 are removed, and then, as illustrated in FIG. 16, a plurality of chips of the coil built-n crystal unit 31 is formed by cutting the entire body into laminate units, each of which includes the crystal substrate 23 and a pair of excitation electrodes 22A and 22 having one pattern serving as both of an excitation electrode and a coil. In addition, although a package is not illustrated, the coil built-in crystal unit 31 may be accommodated in and sealed by the same package as the package 21 illustrated in FIGS. 2A to 2C by a known method.

In addition, when both of the pattern of the upper excitation electrode and the pattern of the lower excitation electrode are to be provided with an inductance component as in a fourth embodiment which will be described later, the lower electrode film 221 may be subjected to the same process as the process performed for the upper electrode film 221 in the process of FIGS. 12A to 14B.

Here, it is verified whether or not the excitation electrode 22A of a pattern having an inductance of, e.g., several μH can be formed by typical photolithography. An inductance by a typical strip line is expressed by the following equation in which a pattern length is denoted by L(mm), a pattern width is denoted by W(mm), and a pattern thickness is denoted by H(mm).

$$0.0002L[\ln\{2L/(W+H)\}+0.2235\{(W+H)/L\}+0.5](\mu H)$$

For example, for W=1 μm (a gap between strip line is also 1 μm), when the pattern is formed to have a rectangular spiral shape, the pattern length L becomes about 120 mm. When the pattern thickness H is 1000 Å, the inductance becomes about 3 μH from the above equation, thereby verifying that it is possible to form the excitation electrode 22A of a pattern having an inductance of, e.g., several μH.

Figure 17A:
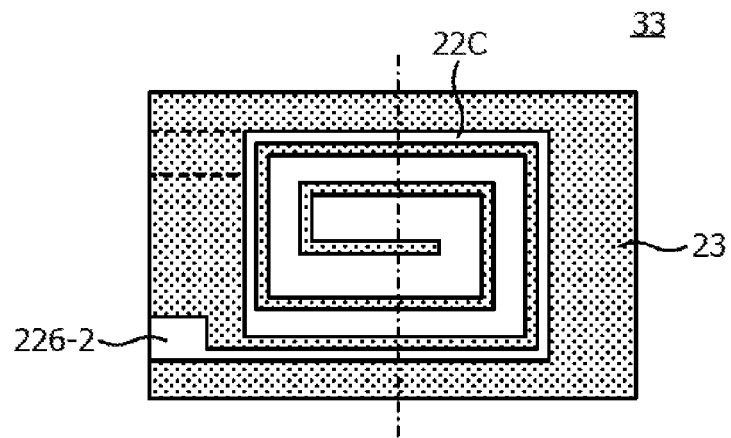
FIGS. 17A and 17B are views illustrating a crystal unit according to a third embodiment.
Figure 17B:
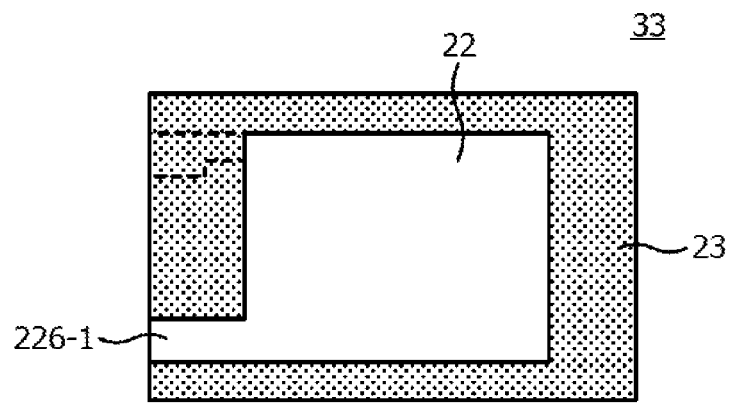

FIGS. 17A and 17B are views illustrating a crystal unit according to a third embodiment. In FIGS. 17A and 17B, substantially the same parts as those in FIGS. 7A to 7C will be denoted by the same reference numerals as used in FIGS. 7A to 7C, and explanation of which will be omitted. FIG. 17A is a top view of a crystal unit 33 as an example of a coil built-in crystal unit, and FIG. 17B is a bottom view of the crystal unit 33. Illustration of packages, electrodes or others is omitted in these figures.

In the third embodiment, an upper excitation electrode 22C is formed in a spiral pattern serving as both of an excitation electrode and a coil such that the upper excitation electrode 22C has an inductance component corresponding to an extension coil. In addition, this spiral pattern has a shape in accordance with an energy distribution of the crystal unit 33. The crystal unit 33 has the same configuration as the crystal unit 31 illustrated in FIGS. 7A to 7C, except that the spiral pattern has a shape in accordance with the energy distribution of the crystal unit 33.

Figure 18A:
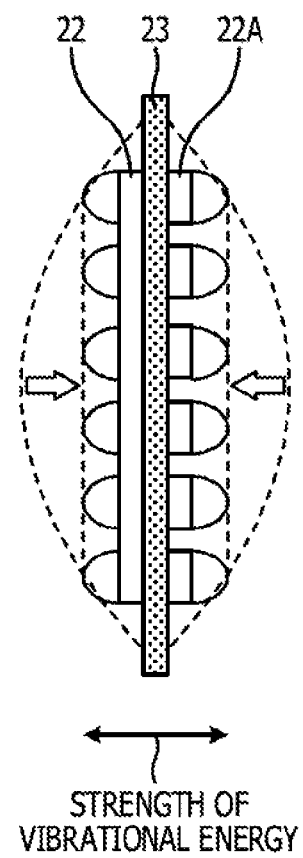
FIGS. 18A and 18B are views illustrating an example of a vibrational energy distribution of a crystal unit.
Figure 18B:
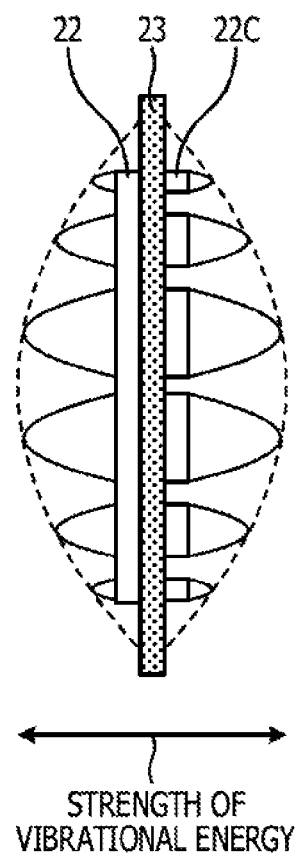

FIGS. 18A and 18B are views illustrating an example of a vibrational energy distribution of a crystal unit. FIG. 18A illustrates a vibrational energy distribution taken along an alternate long and short dashed line of the crystal unit 31 of FIG. 7A, and FIG. 18B illustrates a vibrational energy distribution taken along an alternate long and short dashed line of the crystal unit 33 of FIG. 17A. In FIGS. 18A and 18B, a horizontal axis represents strength of vibrational energy of the crystal unit in an arbitrary unit.

For the crystal unit 31 illustrated in FIGS. 7A to 7C (or the crystal unit 32 illustrated in FIGS. 8A to 8C), an unwanted spurious noise may occur in an oscillation frequency or a quality factor (Q) may be unexpectedly deteriorated. In this case, the vibrational energy distribution indicated by a broken line becomes a low and constant distribution as indicated by an arrow in FIG. 18A. In contrast, by forming the pattern of the excitation electrode 22C serving as both of an excitation electrode and a coil to have a shape in accordance with a vibrational energy distribution as indicated by a broken line in FIG. 18B, even when an unwanted spurious noise occurs in an oscillation frequency or a quality factor (Q) is unexpectedly deteriorated, the vibrational energy distribution can be corrected to a desirable distribution in which vibrational energy increases toward the center of the crystal unit 33.

Figure 19A:
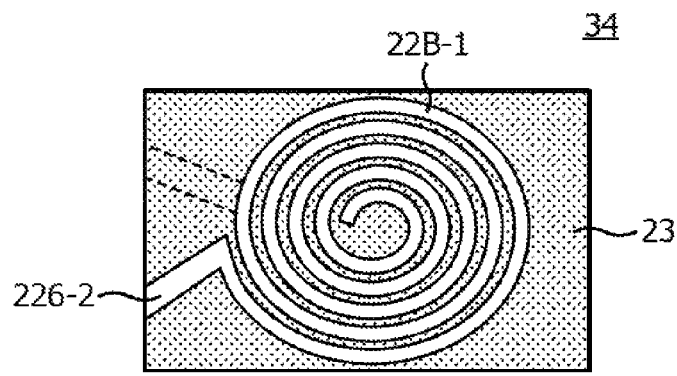
FIGS. 19A to 19C are views illustrating a crystal unit according to a fourth embodiment.
Figure 19B:
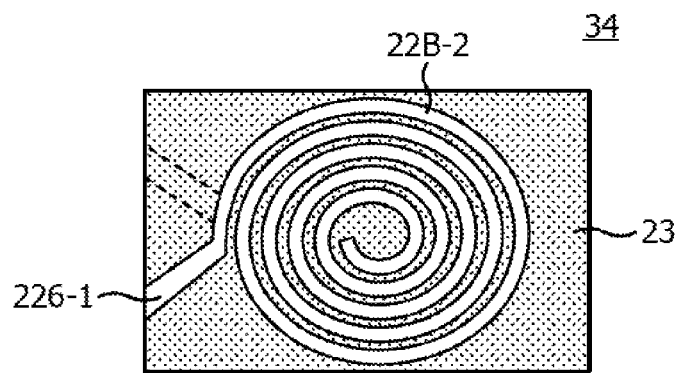
Figure 19C:
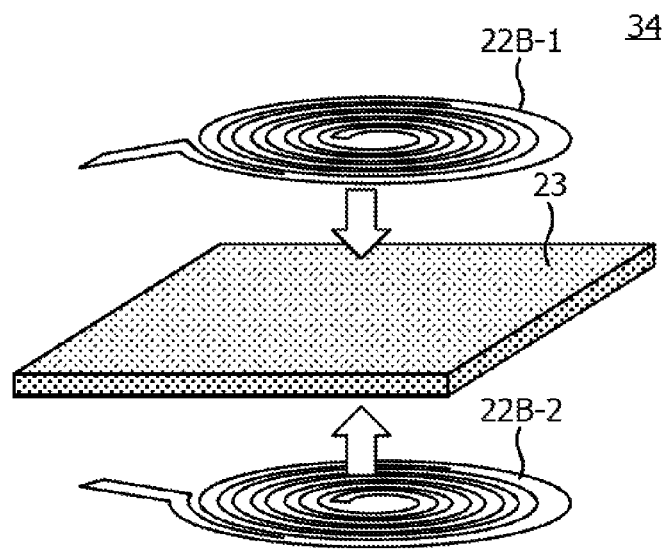

FIGS. 19A to 19C are views illustrating a crystal unit according to a fourth embodiment. In FIGS. 19A to 19C, substantially the same parts as those in FIGS. 7A to 7C will be denoted by the same reference numerals as used in FIGS. 7A to 7C, and explanation of which will be omitted. FIG. 19A is a top view of a crystal unit 34 as an example of a coil built-in crystal unit, FIG. 19B is a bottom view of the crystal unit 34, and FIG. 19C is an exploded perspective view of the crystal unit 34. Illustration of packages, electrodes or others is omitted in these figures.

In the fourth embodiment, an upper excitation electrode 22B-1 has a spiral pattern serving as both of an excitation electrode and a coil such that the upper excitation electrode 22B-1 has an inductance component as illustrated in FIG. 19A, and a lower excitation electrode 22B-2 has a spiral pattern serving as both of an excitation electrode and a coil such that the lower excitation electrode 22B-2 has an inductance component as illustrated in FIG. 19B.

Thus, both of the excitation electrodes 22B-1 and 22B-2 can have a larger inductance component corresponding to an extension coil. In addition, the pattern of each of the excitation electrodes 22B-1 and 22B-2 is not particularly limited but may have, for example, a rectangular spiral shape as illustrated in FIGS. 7A to 7C or a shape in accordance with an energy distribution of the crystal unit as illustrated in FIGS. 17A and 17B. In addition, the patterns of the excitation electrodes 22B-1 and 22B-2 may be same or different from each other. In addition, when both of the excitation electrodes 22B-1 and 22B-2 have the spiral pattern, a spiral direction may be determined in such a manner that inductance components thereof are not cancelled to each other. Inductances of the excitation electrodes 22B-1 and 22B-2 may be same or different from each other.

For example, in VCXO for a phase locked loop (PLL), in order to cope with a demand for extension of a variable range of an oscillation frequency to, e.g., ±several 100 ppm or so, a coil may be inserted in series in a crystal unit. The fourth embodiment is suitable to be used for this crystal unit. In general, the variable oscillation frequency range is narrow because of a high Q value of the crystal unit. However, the variable oscillation frequency range can be widened by using the crystal unit 34 providing an inductance component to both of the excitation electrodes 22B-1 and 22B-2.

Figure 20A:
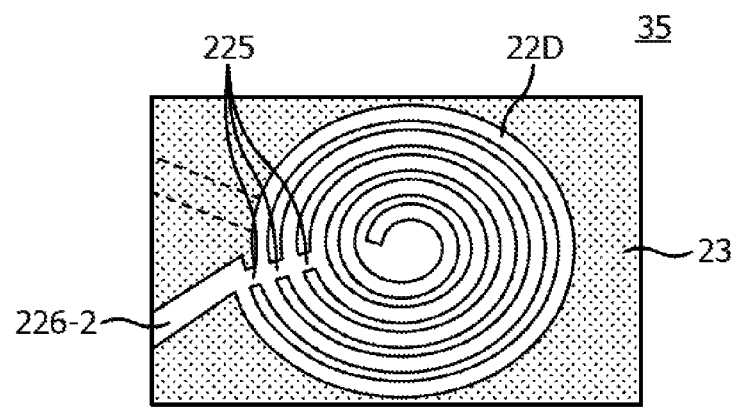
FIGS. 20A and 20B are views illustrating a crystal unit according to a fifth embodiment.
Figure 20B:
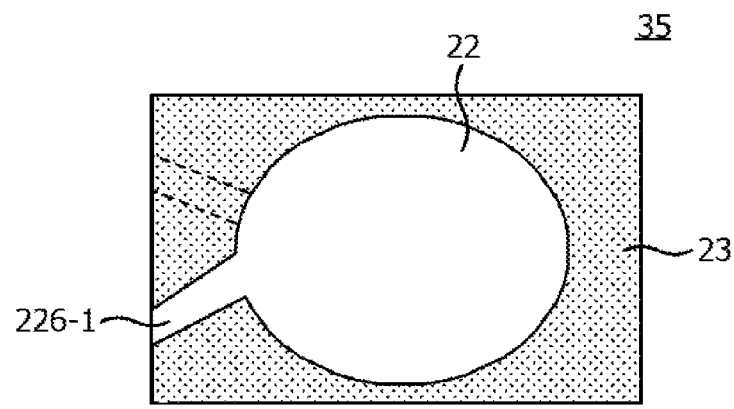

FIGS. 20A and 20B are views illustrating a crystal unit according to a fifth embodiment. In FIGS. 20A and 20B, substantially the same parts as those in FIGS. 7A to 7C will be denoted by the same reference numerals as used in FIGS. 7A to 7C, and explanation of which will be omitted. FIG. 20A is a top view of a crystal unit 35 as an example of a coil built-in crystal unit, and FIG. 20B is a bottom view of the crystal unit 35. Illustration of packages, electrodes or others is omitted in these figures.

In the fifth embodiment, one or more trimming points 225 are formed in a spiral pattern serving as both of an excitation electrode and a coil such as an upper excitation electrode 22D has an inductance component. In this embodiment, three trimming points 225 are formed. When an inductance corresponding to an extension coil is to be changed, the length of a spiral pattern is changed by trimming the trimming points 225 of a pattern by, e.g., a laser beam or the like. Accordingly, it is possible to fabricate the crystal unit 35 with a variable inductance corresponding to the extension coil. The pattern trimming may be performed before and after the crystal unit 35 is accommodated in a package, or may be included in a fabrication process of the crystal unit. In addition, trimming to change the width of the pattern may be performed.

Figure 21A:
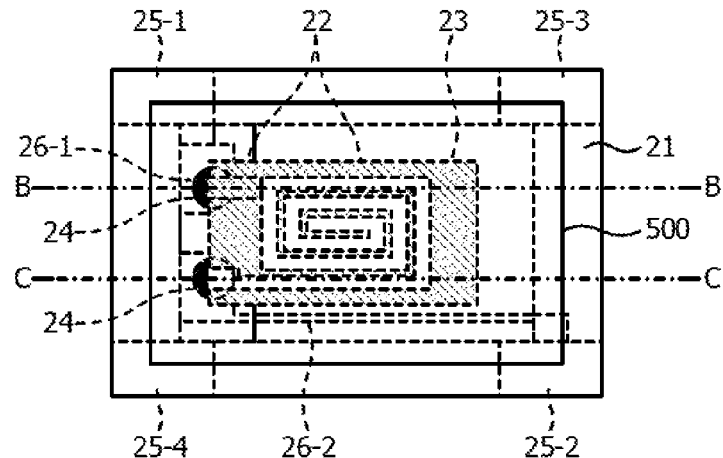
FIGS. 21A to 21C are views illustrating a state where the crystal unit in the fifth embodiment is accommodated in a package.
Figure 21B:
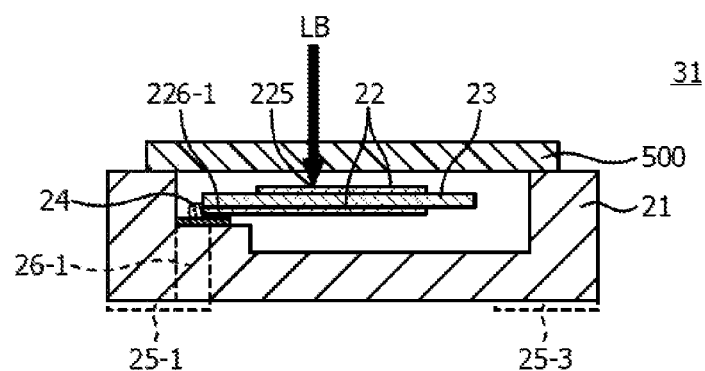
Figure 21C:
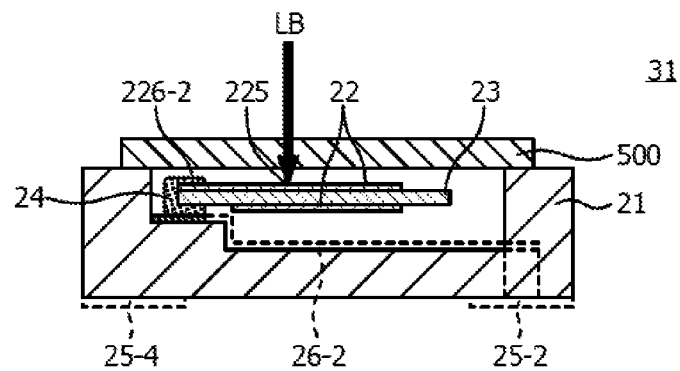

FIGS. 21A to 21C are views illustrating a state where the crystal unit in the fifth embodiment is accommodated in a package. In FIGS. 21A to 21C, substantially the same parts as those in FIGS. 2A to 2C and FIGS. 20A and 20B will be denoted by the same reference numerals as used in FIGS. 2A to 2C and FIGS. 20A and 20B, and explanation of which will be omitted. FIG. 21A is a plan view of a crystal unit 35, FIG. 21B is a sectional view of the crystal unit 35, which is taken along an alternate long and short dashed line B-B in FIG. 21A, and FIG. 21C is a sectional view of the crystal unit 35, which is taken along an alternate long and short dashed line C-C in FIG. 21A.

As illustrated in FIGS. 21A to 21C, a transparent lid 500 is formed at a position facing an upper excitation electrode 22D of a package 21, and the crystal unit 35 is accommodated and sealed in the package 21. In this example, since the lid 500 is transparent, even after the crystal unit 35 is accommodated and sealed in the package 21, an inductance corresponding to an extension coil may be changed by trimming the trimming points 225 of the excitation electrode 22D via the lid 500 by, e.g., a laser beam LB. The lid 500 may be made of, e.g., glass without being limited thereto.

It is to be understood that the lid need not be transparent for a package in which a crystal unit having an untrimmed excitation electrode pattern is accommodated.

Although it is illustrated in FIGS. 21A to 21C that the thickness of the lid 500 is exaggerated for convenience of explanation, the lid 500 may be formed to be thin and buried in the package 21. Therefore, the overall size (length, width and thickness) of the package 21 may be formed in the same manner as, e.g., the package 21 illustrated in FIGS. 2A to 2C. As a result, it is possible to install a coil without impairing the size of a coil built-in crystal unit.

In addition, in combination of the fourth and fifth embodiments, one or more trimming points may be formed in both of an upper excitation electrode and a lower excitation electrode. In this case, in order to trim a pattern of the lower excitation electrode, a transparent window may be installed in a portion of the bottom of the package 21.

Figure 22A:
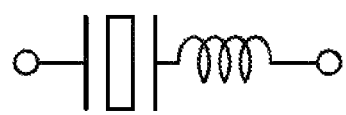
FIGS. 22A to 22D are views illustrating images of equivalent circuits of a crystal unit.
Figure 22C:
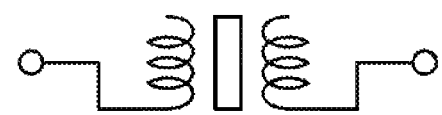
Figure 22B:
Figure 22D:

FIGS. 22A to 22D are views illustrating images of equivalent circuits of a crystal unit. FIG. 22A illustrates a schematic image of an equivalent circuit of the coil built-in crystal unit in the fourth comparative example, FIG. 22B illustrates a schematic image of an equivalent circuit of the coil built-in crystal unit in the first to third embodiments, FIG. 22C illustrates a schematic image of an equivalent circuit of the coil built-in crystal unit in the fourth embodiment, and FIG. 22D illustrates a schematic image of an equivalent circuit of the coil built-in crystal unit in the fifth embodiment. Specifically, FIG. 22A illustrates an image where one excitation electrode of the crystal unit in the fourth comparative example is connected in series to a coil, FIG. 22B illustrates an image where one excitation electrode of the crystal unit in the first to third embodiments serves as a coil, FIG. 22C illustrates an image where both excitation electrodes of the crystal unit in the fourth embodiment serve as a coil, and FIG. 22D illustrates an image where one excitation electrode of the crystal unit in the fifth embodiment serves as a coil.

Figure 23A:
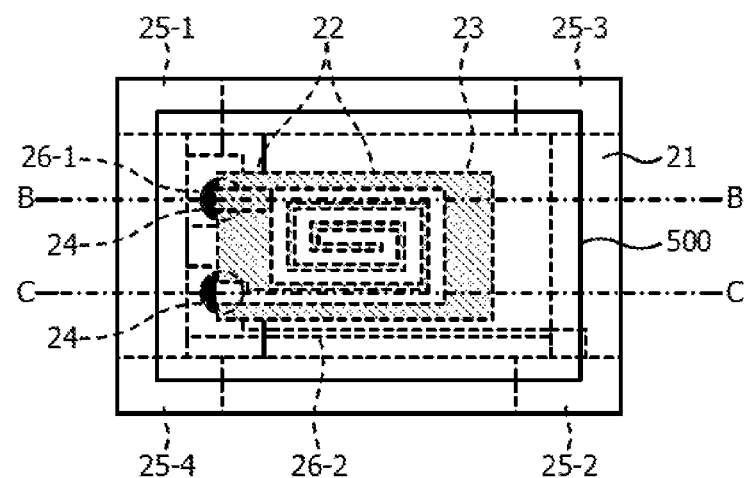
FIGS. 23A to 23C are views illustrating an oscillator according to a sixth embodiment.
Figure 23B:
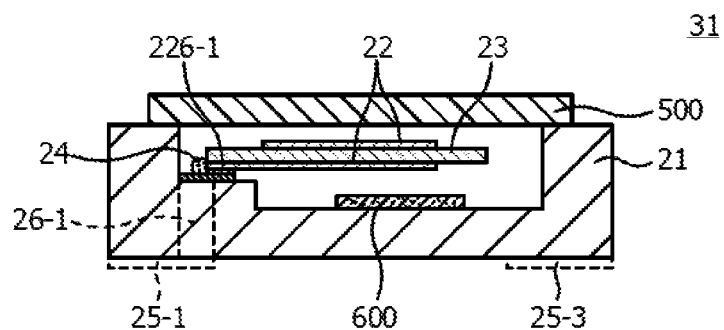
Figure 23C:
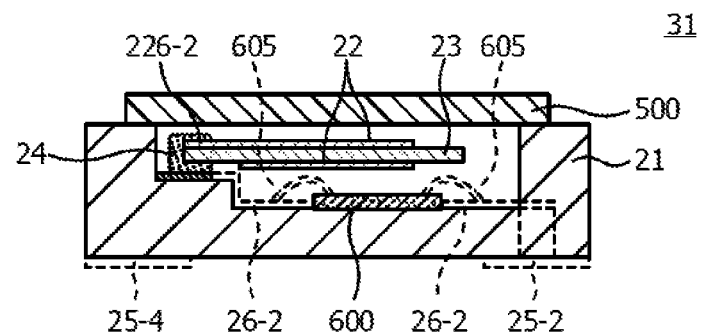

FIGS. 23A to 23C are views illustrating an oscillator according to a sixth embodiment. In FIGS. 23A to 23C, substantially the same parts as those in FIGS. 7A to 7C and FIGS. 21A to 21C will be denoted by the same reference numerals as used in FIGS. 7A to 7C, and explanation of which will be omitted. FIG. 23A is a plan view of an oscillator, FIG. 23B is a sectional view of the oscillator, which is taken along an alternate long and short dashed line B-B in FIG. 23A, and FIG. 23C is a sectional view of the oscillator, which is taken along an alternate long and short dashed line C-C in FIG. 23A.

Figure 1:
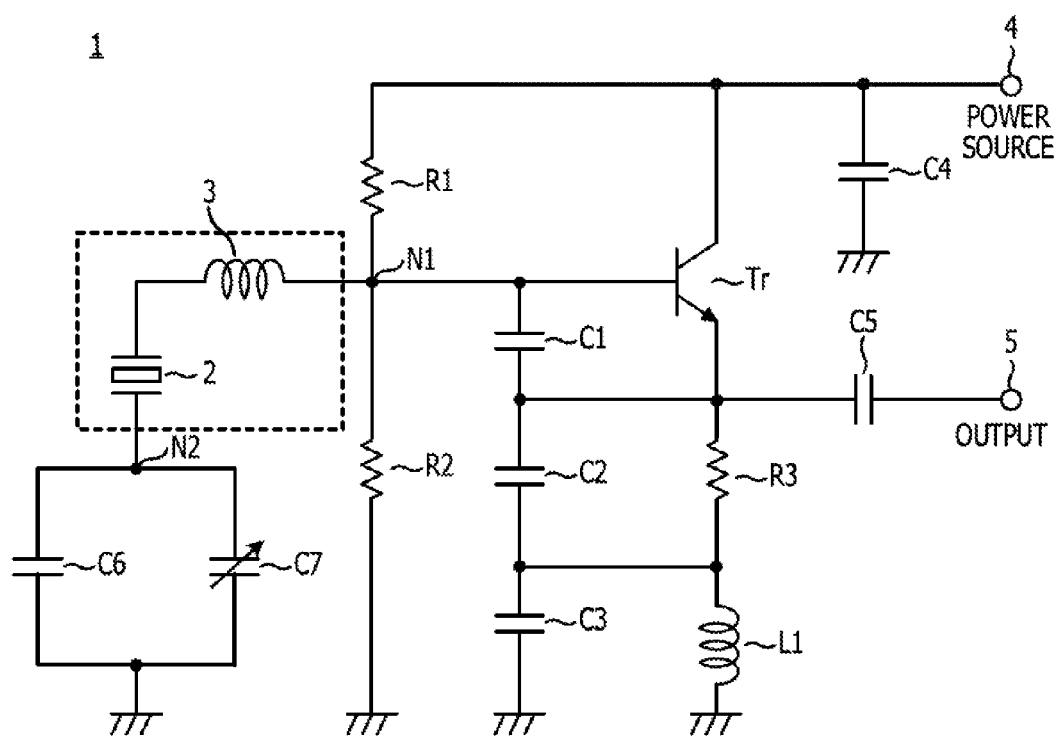
FIG. 1 is a circuit diagram illustrating an example of an oscillator.

Although the crystal unit 31 of the first embodiment illustrated in FIGS. 7A to 7C is accommodated and sealed in the package 21 illustrated in FIGS. 23A to 23C, it is to be understood that any one of the crystal units 32 to 35 of the second to fifth embodiments may be accommodated and sealed therein. An integrated circuit (IC) chip 600 is accommodated in the package 21. The IC chip 600 contains an oscillation circuit except for a portion surrounded by a broken line in FIG. 1. For example, a node N1 (see, e.g., FIG. 1) of the oscillation circuit in the IC chip 600 is electrically connected to the upper excitation electrode 22A of the crystal unit 31 by a wire bonding 605 via the wiring 26-2. In addition, a node N2 (see, e.g., FIG. 1) of the oscillation circuit is electrically connected to the lower excitation electrode 22 of the crystal unit 31 by another wire bonding 605 via the wiring 26-1.

In this case, the wiring 26-1 needs not be electrically connected to the electrode 25-1, and the wiring 26-2 needs not be electrically connected to the electrode 25-2. For example, the terminal 4 of the oscillation circuit may be electrically connected to the electrode 25-1 by a wiring boding (not illustrated) via a wiring (not illustrated), and the electrode 25-1 may be used as a power source terminal. In addition, the terminal 5 of the oscillation circuit may be electrically connected to the electrode 25-3 by a wiring boding (not illustrated) via a wiring (not illustrated), and the electrode 25-3 may be used as an output terminal. Further, the grand of the oscillation circuit may be electrically connected to the electrode 25-4 by a wiring boding (not illustrated) via a wiring (not illustrated), and the electrode 25-4 may be used as a grand terminal.

According to this embodiment, it is possible to fabricate a small oscillator including a crystal unit and an oscillation circuit accommodated in a package.

FIG. 24 is a table illustrating results of evaluation on a crystal unit mounting area, an inductance corresponding to an extension coil, and a crystal unit production cost for the conventional example illustrated in FIGS. 2A to 2C, the first to fourth comparative examples illustrated in FIGS. 3A to 6C, and the first to sixth embodiments illustrated in FIGS. 7A to 7C, FIGS. 8A to 8C, FIGS. 17A and 17B, FIGS. 19A to 19C, FIGS. 20A and 20B, and FIGS. 23A to 23C. In FIG. 24, "x" represents "impossible" as an evaluation result, "Δ" represents "possible" as an evaluation result, and "○" represents "good" as an evaluation result. As can be seen from FIG. 24, it is confirmed that each of the first to sixth embodiments may provide a smaller crystal unit mounting area than the conventional example and the first and second comparative examples, provide a larger inductance corresponding to the extension coil than the third comparative example, and provide a lower crystal unit production cost than the conventional example and the first to fourth comparative examples.

According to the above-described embodiments, it is possible to install a coil without impairing the size of a coil built-in crystal unit. In addition, according to the above-described embodiments, by forming an inductance component in an excitation electrode itself on a crystal substrate, it is possible to fabricate a coil built-in crystal unit and miniaturize the crystal unit and an oscillator.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to an illustrating of the superiority and inferiority of the invention. Although the embodiments of the present invention have been described in detail, it should be understood that the various changes, substitutions, and alterations could be made hereto without departing from the spirit and scope of the invention.

What is claimed is:

1. A crystal unit comprising:
a crystal substrate; and
a pair of excitation electrodes formed respectively on both surfaces of the crystal substrate,
wherein each of the pair of excitation electrodes has a pattern serving as both of an excitation electrode and a coil, and
wherein the pattern has a shape in accordance with a vibrational energy distribution of the crystal unit.

2. The crystal unit according to claim 1, wherein the pattern is a spiral pattern.

3. The crystal unit according to claim 1, wherein an inductance of the coil is variable.

4. The crystal unit according to claim 3, wherein the pattern has one or more trimming points trimmed when the inductance of the coil is changed.

5. The crystal unit according to claim 1, further comprising
a package in which the crystal substrate and the pair of excitation electrodes are accommodated.

6. The crystal unit according to claim 1, further comprising:
a package in which the crystal substrate and the pair of excitation electrodes are accommodated; and
a transparent lid which is formed at a position facing the one excitation electrode and sealing the package.

7. An oscillator comprising:
a package;
a crystal unit accommodated in the package, the crystal unit including:
a crystal substrate;
a pair of excitation electrodes formed respectively on both surfaces of the crystal substrate; and
an oscillation circuit accommodated in the package and electrically connected to the crystal unit,
wherein each of the pair of excitation electrodes has a pattern serving as both of an excitation electrode and a coil, and
wherein the pattern has a shape in accordance with a vibrational energy distribution of the crystal unit.

8. A method for fabricating a crystal unit, comprising:
forming a pair of electrode films on both surfaces of a crystal substrate, respectively; and
forming each of the electrode films in a pattern serving as both of an excitation electrode and a coil when patterning the pair of electrode films into a pair of excitation electrodes, the pattern having a shape in accordance with a vibrational energy distribution of the crystal unit, the crystal unit including the crystal substrate and the pair of excitation electrodes.

9. The method according to claim 8, wherein
the patterning includes:
forming a resist on each of the electrode films;
exposing the resist using a mask having a pattern formed on the resist;
developing a pattern of the exposed resist;
etching each of the electrode films using the developed pattern of the resist as a mask; and
removing the resist.

10. The method according to claim 8, wherein
the pattern is formed in a spiral shape.

11. The method according to claim 8, wherein
the pattern is formed as a pattern having one or more trimming points trimmed when an inductance of the coil is changed.

12. The method according to claim 11, wherein
the inductance of the coil is changed by trimming the one or more trimming points of the pattern.

* * * * *